United States Patent
Choi et al.

(10) Patent No.: US 10,862,069 B2
(45) Date of Patent: Dec. 8, 2020

(54) OLED PANEL BOTTOM PROTECTION FILM, AND ORGANIC LIGHT-EMITTING DISPLAY DEVICE COMPRISING SAME

(71) Applicant: Samsung Display Co., Ltd., Yongin-si (KR)

(72) Inventors: Youngseo Choi, Yongin-si (KR); Minju Kim, Yongin-si (KR); Sangshin Kim, Asan-si (KR); Jinhyuk Kim, Asan-si (KR); Youngdon Park, Asan-si (KR); Youngbin Baek, Asan-si (KR); Sangwoo Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/478,836

(22) PCT Filed: Jan. 18, 2018

(86) PCT No.: PCT/KR2018/000819
§ 371 (c)(1),
(2) Date: Jul. 17, 2019

(87) PCT Pub. No.: WO2018/135864
PCT Pub. Date: Jul. 26, 2018

(65) Prior Publication Data
US 2020/0058900 A1    Feb. 20, 2020

(30) Foreign Application Priority Data
Jan. 18, 2017    (KR) .................. 10-2017-0008526

(51) Int. Cl.
*H01L 51/52* (2006.01)
*B32B 7/12* (2006.01)
(Continued)

(52) U.S. Cl.
CPC .......... *H01L 51/5253* (2013.01); *B32B 7/06* (2013.01); *B32B 7/12* (2013.01); *B32B 27/08* (2013.01);
(Continued)

(58) Field of Classification Search
None
See application file for complete search history.

(56) References Cited

U.S. PATENT DOCUMENTS

2005/0040763 A1    2/2005    Yoon et al.
2009/0022967 A1    1/2009    Inenaga
(Continued)

FOREIGN PATENT DOCUMENTS

JP    2004-223923 A    8/2004
KR    10-2005-0019451 A    3/2005
(Continued)

OTHER PUBLICATIONS

EPO Partial Supplementary European Search Report dated Sep. 30, 2020, issued in corresponding European Patent Application No. 18741015.4 (10 pages).

*Primary Examiner* — Asok K Sarkar
(74) *Attorney, Agent, or Firm* — Lewis Roca Rothgerber Christie LLP

(57) ABSTRACT

A bottom protection film for an OLED panel is provided. More particularly, a bottom protection film for an OLED panel, which has excellent alignment process workability and excellent adhesion to an OLED panel, and is capable of preventing static electricity through an antistatic treatment and preventing an electrical short circuit at the same time, and an organic light-emitting display device including the bottom protection film are provided.

20 Claims, 3 Drawing Sheets

(51) Int. Cl.
- *B32B 7/06* (2019.01)
- *B32B 27/08* (2006.01)
- *B32B 27/36* (2006.01)
- *B32B 37/02* (2006.01)
- *B32B 37/12* (2006.01)
- *B32B 37/18* (2006.01)
- *B32B 38/10* (2006.01)
- *C09J 9/00* (2006.01)
- *C09J 11/06* (2006.01)
- *C09J 133/08* (2006.01)
- *H01L 51/00* (2006.01)

(52) U.S. Cl.
CPC .............. *B32B 27/36* (2013.01); *B32B 37/02* (2013.01); *B32B 37/12* (2013.01); *B32B 37/182* (2013.01); *B32B 38/10* (2013.01); *C09J 9/00* (2013.01); *C09J 11/06* (2013.01); *C09J 133/08* (2013.01); *H01L 51/004* (2013.01); *B32B 2250/02* (2013.01); *B32B 2250/244* (2013.01); *B32B 2255/10* (2013.01); *B32B 2255/26* (2013.01); *B32B 2367/00* (2013.01); *B32B 2405/00* (2013.01); *B32B 2457/206* (2013.01); *H01L 2251/5392* (2013.01)

(56) References Cited

U.S. PATENT DOCUMENTS

| | | |
|---|---|---|
| 2012/0038267 A1 | 2/2012 | Hanamura et al. |
| 2014/0091288 A1 | 4/2014 | Lee et al. |
| 2017/0121565 A1* | 5/2017 | Yasui .................. G02B 5/3033 |
| 2017/0125136 A1* | 5/2017 | Park ..................... H01L 51/003 |
| 2018/0047938 A1* | 2/2018 | Kishimoto ............ H01L 27/323 |

FOREIGN PATENT DOCUMENTS

| | | |
|---|---|---|
| KR | 10-2007-0069580 A | 7/2007 |
| KR | 10-2007-0101711 A | 10/2007 |
| KR | 10-2014-0043022 A | 4/2014 |
| KR | 10-1801689 B1 | 11/2017 |

* cited by examiner

OLED PANEL BOTTOM PROTECTION FILM, AND ORGANIC LIGHT-EMITTING DISPLAY DEVICE COMPRISING SAME

CROSS-REFERENCE TO RELATED APPLICATION(S)

This application is a National Phase Patent Application of International Patent Application Number PCT/KR2018/000819, filed on Jan. 18, 2018, which claims priority of Korean Patent Application No. 10-2017-0008526, filed Jan. 18, 2017. The entire contents of all of which are incorporated herein by reference.

TECHNICAL FIELD

The present disclosure relates to a bottom protection film for an OLED panel, and more particularly, to a bottom protection film for an OLED panel, the bottom protection film having excellent alignment process workability and excellent adhesion to an OLED panel, and being capable of preventing generation of static electricity through an antistatic treatment and preventing an electrical short circuit, and an organic light-emitting display device including the bottom protection film for an OLED panel.

BACKGROUND ART

Recently, flat panel displays have been gaining attention as a display device according to the remarkable progress in information communication technology and expansion of the market. Examples of the flat panel displays include liquid crystal displays, plasma display panels, and organic light emitting diodes.

Organic light emitting devices have advantages such as a high response speed, a light weight, a small thickness, a compact size, low power consumption, self-emitting characteristics, and flexible characteristics, and thus are increasingly demanded for next-generation display devices and flexible displays, and even in illumination.

An organic light emitting device is manufactured by sequentially depositing, on a glass substrate, a transparent electrode, a hole injection layer, a hole transport layer, an organic emitting layer, an electron transport layer, an electron injection layer, and a metal electrode in an order, and emits light based on the principle that light is emitted by using energy discharged when electrons and holes supplied from both electrodes recombine in the organic emitting layer.

An organic light-emitting device is likely to deteriorate due to external factors such as external humidity or oxygen or ultraviolet rays, and thus a packaging technique of encapsulating the organic light emitting device is essential, and for applications over a broad range, an organic light-emitting device is required to be thin.

Meanwhile, a bottom protection film is included under an OLED panel to protect the OLED panel, and a bottom protection film for an OLED panel according to the related art has a high defect rate due to poor alignment process workability, and static electricity and electrical short circuit could not be prevented, and adhesion to the OLED panel was poor.

Thus, there is the pressing need for research into a bottom protection film for an OLED panel, for which alignment process workability is excellent, and excellent adhesion to an OLED panel is provided, and generation of static electricity may be prevented through antistatic treatment, and also an electrical short circuit may be prevented.

DESCRIPTION OF EMBODIMENTS

Technical Problem

The present disclosure provides a bottom protection film for an OLED panel, for which alignment process workability is excellent, and excellent adhesion to an OLED panel is provided, and generation of static electricity may be prevented through antistatic treatment, and also an electrical short circuit may be prevented.

Solution to Problem

According to an aspect of the present disclosure, there is provided a bottom protection film for an OLED panel, including: a base film including a first adhesive layer formed on an upper surface of a first base material; a carrier film including a second adhesive layer adhered to a lower surface of the first base material and a second base material adhered to a lower surface of the second adhesive layer; and a liner film adhered using the first adhesive layer, wherein the liner film, the first base material, the first adhesive layer, the second base material, and the second adhesive layer all satisfy Condition (1) and Condition (2) below:

$$100 \leq \frac{a_1}{A}, \quad (1)$$

$$23 \leq \frac{a_3}{b_3+c_3}, \frac{b_3}{c_3} < 1, \quad (2)$$

where, A denotes the average of the other values except a maximum value and a minimum value of surface resistances from among $a_2$, $b_1$, $b_2$, $c_1$, and $c_2$, wherein $a_1$ denotes a surface resistance (Ω/sq) of the first adhesive layer, $a_2$ denotes a surface resistance (Ω/sq) of the first base material, $b_1$ and $b_2$ respectively denote surface resistance (Ω/sq) of upper and lower surfaces of the liner film, $c_1$ denotes a surface resistance (Ω/sq) of the second adhesive layer, and $c_2$ denotes a surface resistance (Ω/sq) of the second base material, and $a_3$ denotes an adhesion (gf/in) of the base film, $b_3$ denotes a releasing force (gf/in) of the liner film, and $c_3$ denotes an exfoliation force (gf/in) of the carrier film.

Advantageous Effects of Disclosure

According to a bottom protection film for an OLED panel of the present disclosure, alignment process workability is excellent, adhesion to an OLED panel is high, and generation of static electricity may be prevented through antistatic treatment, and also an electrical short circuit may be prevented at the same time.

BEST MODE

Figure 1:
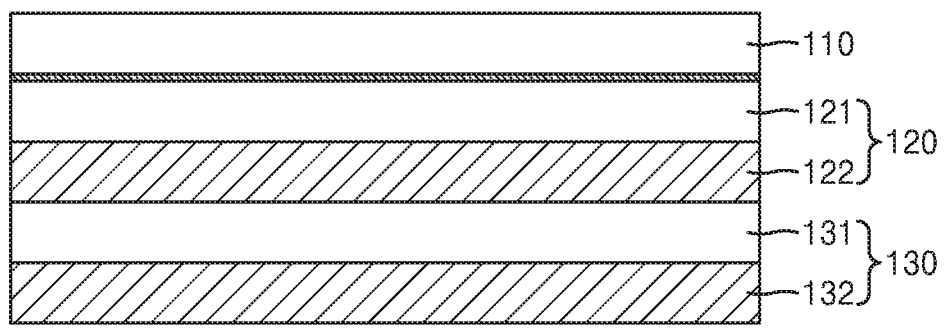
FIG. 1 is a cross-sectional view of a bottom protection film for an OLED panel, according to an embodiment of the present disclosure.

According to an embodiment of the present disclosure, a bottom protection film for an OLED panel is provided, the bottom protection film including: a base film including a first adhesive layer formed on an upper surface of a first base material; a carrier film including a second adhesive layer adhered to a lower surface of the first base material and a second base material adhered to a lower surface of the second adhesive layer; and a liner film adhered using the first adhesive layer, wherein the liner film, the first base material, the first adhesive layer, the second base material, and the second adhesive layer all satisfy Condition (1) and Condition (2) below.

$$100 \leq \frac{a_1}{A}, \tag{1}$$

$$23 \leq \frac{a_3}{b_3 + c_3}, \frac{b_3}{c_3} < 1. \tag{2}$$

Provided that, A denotes the average of the other values except a maximum value and a minimum value of surface resistances from among $a_2$, $b_1$, $b_2$, $c_1$, and $c_2$, wherein $a_1$ denotes a surface resistance (Ω/sq) of the first adhesive layer, $a_2$ denotes a surface resistance (Ω/sq) of the first base material, $b_1$ and $b_2$ respectively denote surface resistance (Ω/sq) of upper and lower surfaces of the liner film, ci denotes a surface resistance (Ω/sq) of the second adhesive layer, and $c_2$ denotes a surface resistance (Ω/sq) of the second base material.

Also, $a_3$ denotes an adhesion (gf/in) of the base film, $b_3$ denotes a releasing force (gf/in) of the liner film, and $c_3$ denotes an exfoliation force (gf/in) of the carrier film.

According to an embodiment of the present disclosure, the liner film, the first base material, the first adhesive layer, the second base material, and the second adhesive layer may all satisfy Condition (1) and Condition (2) below.

$$10^3 \leq \frac{a_1}{A} \leq 10^5, \tag{1}$$

$$30 \leq \frac{a_3}{b_3 + c_3} \leq 560, 0.3 \leq \frac{b_3}{c_3} \leq 0.9. \tag{2}$$

In addition, the first adhesive layer may have a surface resistance of $1.0 \times 10^{10}$ to $1.0 \times 10^{12}$ Ω/sq, and the first base material may have a surface resistance of $1.0 \times 10^5$ to $1.0 \times 10^9$ Ω/sq, and upper and lower surfaces of the liner film may each have surface resistance of $1.0 \times 10^5$ to $1.0 \times 10^9$ Ω/sq, and the second adhesive layer and the second base material may each have surface resistance of $1.0 \times 10^5$ to $1.0 \times 10^9$ Ω/sq.

Also, the liner film may have a releasing force of 5 gf/in or less.

Also, an adhesion of the first adhesive layer measured by using a measurement method below may be 250 gf/in or higher.

[Measurement Method]

The first adhesive layer was adhered to glass, and after 24 hours, adhesion of the first adhesive layer was measured when the first adhesive layer was exfoliated at 180° at a rate of 5 mm per second.

In addition, an exfoliation force between the base film and the carrier film may be 3 to 10 gf/in.

In addition, the first base material and the second base material may be a PET base material, and the first adhesive layer and the second adhesive layer may be acrylic adhesive layers.

In addition, a lower surface of the liner film may be silicon-release treated.

In addition, at least a surface of each of the liner film, the first base material, and the second base material may be antistatic treated.

In addition, the first adhesive layer and the second adhesive layer may include an antistatic agent.

In addition, the first adhesive layer may have a thickness of 10 to 30 μm, and the first base material may have a thickness of 65 to 140 μm.

In addition, the liner film may have a thickness of 55 to 95 μm, and the second adhesive layer may have a thickness of 1 to 10 μm, and the second base material may have a thickness of 20 to 60 μm.

Meanwhile, the present disclosure provides a method of applying a bottom protection film for an OLED panel, wherein the method includes: exfoliating a liner film from the bottom protection film for an OLED panel; attaching a base film and a carrier film, from which the liner film is exfoliated, to an OLED panel; and exfoliating the carrier film from the base film and the carrier film that are attached to the OLED panel.

Meanwhile, the present disclosure provides an organic light-emitting display device including the above-described base film.

MODE OF DISCLOSURE

Hereinafter, embodiments of the present disclosure will be described in detail with reference to the accompanying drawings, which will be readily apparent to those skilled in the art to which the present disclosure pertains. The present disclosure may be embodied in many different forms and should not be construed as limited to the embodiments set forth herein. In the drawings, portions unrelated to the description are omitted for clarity of the present disclosure, and like reference numerals refer to like elements throughout.

As illustrated in FIG. 1, a bottom protection film for an OLED panel according to an embodiment of the present disclosure includes a base film 120 including a first adhesive layer 121 formed on an upper surface of a first base material 122, a carrier film 130 including a second adhesive layer 131 adhered to a lower surface of the first base material 122 and a second base material 132 adhered to a lower surface of the second adhesive layer 131, and a liner film 110 adhered using (adhered to and using) the first adhesive layer 121.

Before describing each layer constituting the bottom protection film for an OLED panel according to the present disclosure as illustrated in FIG. 1, the reason why the bottom protection film for an OLED panel according to the present disclosure, and the liner film 110, the base film 120, the first adhesive layer 121 and the first base material 122 included in the base film 120, the carrier film 130, the second adhesive layer 131 and the second base material 132 included in the carrier film 130 that are included in the bottom protection film for an OLED panel have to satisfy Condition (1) and Condition (2) below will be described first.

In an OLED panel, to the bottom of which a protection film is attached, when a surface resistance of the protection film is low, electricity flows easily therethrough, and thus, an electrical short circuit is likely to occur; when a surface resistance of the protection film is high, static electricity is likely to occur when attaching a bottom protection film for an OLED panel to the OLED panel, and thus, there is the problem that a base film is also exfoliated when exfoliating a liner film in an alignment process, and this may adversely affect the OLED panel to which the protection film is attached. In addition, when attaching a protection film to the bottom of the OLED panel, the liner film 110 is first exfoliated, and then the base film 120 and the carrier film 130 stacked on the OLED panel may be attached, and when a releasing force of the liner film 110 is greater than an exfoliation force between the base film 120 and the carrier film 130, exfoliation between the base film 120 and the carrier film 130 is generated and thus workability may be degraded when exfoliating the liner film 110.

Accordingly, the bottom protection film for an OLED panel should have appropriate surface resistance, releasing force, adhesion, and exfoliation force. The bottom protection film for an OLED panel according to the present disclosure has to satisfy both Condition (1) and Condition (2) below to resolve the problems as described above.

Condition (1) may be $$100 \le \frac{a_1}{A},$$

preferably, $$10^3 \le \frac{a_1}{A} \le 10^5,$$

and Condition (2) may be $$23 \le \frac{a_3}{b_3 + c_3}, \frac{b_3}{c_3} < 1,$$

preferably, $$30 \le \frac{a_3}{b_3 + c_3} \le 560, 0.3 \le \frac{b_3}{c_3} \le 0.9.$$

Provided that, A denotes the average of the other values except a maximum value and a minimum value of surface resistances from among $a_2$, $b_1$, $b_2$, $c_1$, and $c_2$, and $a_1$ denotes a surface resistance ($\Omega$/sq) of a first adhesive layer, $a_2$ denotes a surface resistance ($\Omega$/sq) of a first base material, $b_1$ and $b_2$ respectively denote surface resistance ($\Omega$/sq) of upper and lower surfaces of a liner film, $c_1$ denotes a surface resistance ($\Omega$/sq) of a second adhesive layer, and $c_2$ denotes a surface resistance ($\Omega$/sq) of a second base material. Also, $a_3$ denotes an adhesion (gf/in) of a base film, $b_3$ denotes a release force (gf/in) of the liner film, and $c_3$ denotes an exfoliation force (gf/in) of a carrier film.

When $$\frac{a_1}{A}$$

is less than 100 in Condition (1), an electrical short circuit may occur, and alignment process workability may be poor. In addition, when $$\frac{a_3}{b_3 + c_3}$$

is less than 23 in Condition (2), an adhesion of the protection film attached to an OLED panel may be poor, and alignment process workability may be poor. In addition, when $$\frac{b_3}{c_3}$$

is equal to or greater than 1, and when exfoliating the liner film 110 on the base film 120, exfoliation between the base film 120 and the carrier film 130 may occur, thus significantly increasing a defect rate, accordingly.

Hereinafter, components included in the bottom protection film for an OLED panel will be described in detail.

First, the liner film 110 will be described.

The liner film 110 has a function of protecting an upper surface of the base film 120. In a process of attaching a bottom protection film for an OLED panel according to the present disclosure, to an OLED panel, an alignment process may be performed, and in this case, the liner film 110 is first exfoliated, and then the base film 120 and the carrier film 130 may be attached to the OLED panel.

Here, in an operation of exfoliating the liner film 110, in order to prevent exfoliation between the base film 120 and the carrier film 130 and improve alignment process workability, surface resistances of upper and lower surfaces of the liner film 110 may be each $1.0 \times 10^5$ to $1.0 \times 10^9$ $\Omega$/sq, preferably, $1.3 \times 10^5$ to $8.0 \times 10^8$ $\Omega$/sq, to satisfy Condition (1). When the surface resistances of the upper and lower surfaces of the liner film 110 do not satisfy the above ranges, when exfoliating the liner film 110 from the upper surface of the base film 120, exfoliation between the base film 120 and the carrier film 130 may be generated, and this may significantly increase a defect rate and deteriorate alignment process workability.

Meanwhile, to prevent generation of static electricity, at least a surface of the liner film 110 according to the present disclosure, preferably upper and lower surfaces thereof, may be antistatic treated. Through such an antistatic treatment, generation of static electricity may be prevented and the above-described surface resistance may be achieved, thereby enhancing alignment process workability.

In addition, in order to prevent exfoliation between the base film 120 and the carrier film 130 while exfoliating the liner film 110, a releasing force of the liner film 110 may be relatively small compared to an exfoliation force between the base film 120 and the carrier film 130, and a releasing force of the liner film 110 may preferably be 5 gf/in or less, more preferably, 2 to 4 gf/in. When the releasing force of the liner film 110 exceeds 5 gf/in, and when exfoliating the liner film 110 from the upper surface of the base film 120, exfoliation between the base film 120 and the carrier film 130 may be generated, and this may significantly increase a defect rate.

Figure 2:
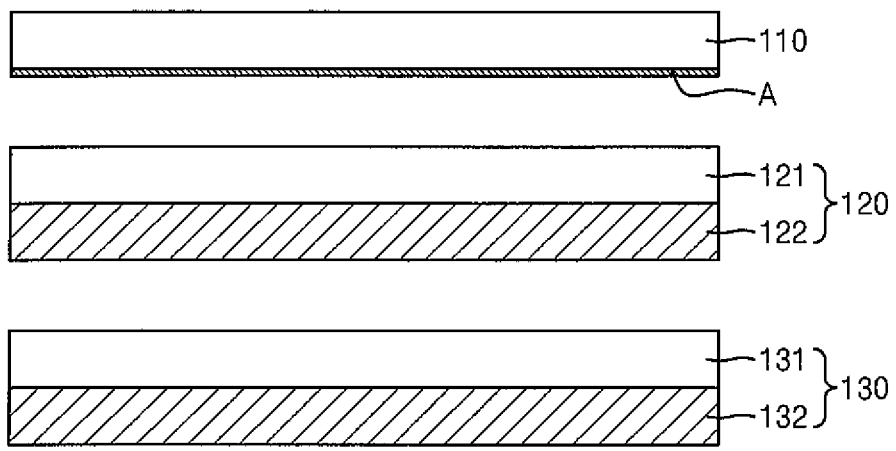
FIG. 2 is a disassembled cross-sectional view of a bottom protection film for an OLED panel, according to an embodiment of the present disclosure.

As illustrated in FIG. 2, in order for the liner film 110 to exhibit a releasing force as described above, a lower surface of the liner film 110 may be release-treated (A). In the release treatment above, any material that is typically used in release treatment may be used without limitation, and preferably, releasing may be performed using silicon to exhibit an appropriate level of releasing force.

Any material that is typically used in a liner film in the art may be used as the liner film 110 without limitation, and preferably, a PET base material may be used. Also, a thickness of the liner film 110 is not limited as long as the thickness is a thickness of a liner film that may be typically used in a protection film, and may preferably be 55 to 95 µm, more preferably 60 to 90 µm, but is not limited thereto.

Next, the base film 120 will be described.

The base film 120 includes the first adhesive layer 121 formed on an upper surface of the first base material 122.

The base film 120 is directly attached to an OLED panel and has a function of protecting the bottom of the OLED panel. In a process of attaching a bottom protection film for an OLED panel according to the present disclosure, to an OLED panel, an alignment process may be performed, and in this case, the liner film 110 is first exfoliated, and then the base film 120 and the carrier film 130 are attached to the OLED panel, and then the carrier film 130 may be exfoliated to locate a protection film on the bottom of the OLED panel.

When the protection film is attached to the OLED panel, in order to prevent an electrical short circuit, prevent exfoliation between the base film 120 and the carrier film 130 in an operation of exfoliating the liner film 110, and improve alignment process workability, a surface resistance of the first base material 122 may be $1.0 \times 10^5$ to $1.0 \times 10^9$ Ω/sq, preferably, $1.3 \times 10^5$ to $8.0 \times 10^8$ Ω/sq, to satisfy Condition (1). When the surface resistance of the first base material 122 does not satisfy the above ranges, an electrical short circuit may occur, and alignmenr process workability may be degraded.

Meanwhile, to prevent generation of static electricity, at least one surface of the first base material 122 according to the present disclosure, preferably a lower surface thereof, may be antistatic treated. Through antistatic treatment, generation of static electricity may be prevented and the above-described surface resistance may be obtained, thereby enhancing alignment process workability.

Any material that is typically used in a protection film in the art may be used as the first base materials 122 without limitation, and preferably, a PET base material may be used. In addition, a thickness of the first base material 122 is not limited as long as the thickness may be typically used in a protection film, and may preferably be 65 to 140 µm, more preferably, 70 to 130 µm.

Meanwhile, when the protection film is attached to the OLED panel, in order to prevent an electrical short circuit, prevent exfoliation between the base film 120 and the carrier film 130 in an operation of exfoliating the liner film 110, and improve alignment process workability, a surface resistance of the first adhesive layer 121 may be $1.0 \times 10^{10}$ to $1.0 \times 10^{12}$ Ω/sq, preferably, $1.5 \times 10^{10}$ to $1.0 \times 10^{11}$ Ω/sq, to satisfy Condition (1). When the surface resistance of the first adhesive layer 121 does not satisfy the above ranges, an electrical short circuit may occur, and alignment process workability may be degraded.

The first adhesive layer 121 included in the base film 120 according to the present disclosure may include an antistatic agent to prevent generation of static electricity. By including the antistatic agent, generation of static electricity may be prevented and the above-described surface resistance may be exhibited to thereby enhance alignment process workability.

Meanwhile, after attaching the bottom protection film for an OLED panel to the bottom of an OLED panel, in order to prevent exfoliation of the protection film attached to the bottom of the OLED panel, an adhesion of the base film 120 has to be sufficiently large, and preferably, to satisfy Condition (2), an adhesion thereof measured using a measurement method below may be 250 gf/in or higher, more preferably, the adhesion may be 1000 to 2300 gf/in.

[Measurement Method]

The first adhesive layer was adhered to glass, and after 24 hours, an adhesion thereof was measured when the first adhesive layer was exfoliated at 180° at a rate of 5 mm per second.

When the adhesion of the base film 120 measured using the measurement method is less than 250 gf/in, the base film 120 may be exfoliated from the OLED panel.

As the first adhesive layer 121 included in the base film 120, any material for typically forming an adhesive layer in the art may be used without limitation, and the first adhesive layer 121 may preferably be an acrylic adhesive layer. In addition, a thickness of the first adhesive layer 121 is not limited as long as the thickness is a thickness of an adhesive layer typically included in a protection film, and may preferably be 10 to 30 µm, more preferably, 12 to 26 µm.

Detailed description of the first adhesive layer 121 will be provided with reference to a manufacturing method which will be described later.

Next, the carrier film 130 will be described.

The carrier film 130 includes the second adhesive layer 131 adhered to a lower surface of the first base material 122 and the second base material 132 adhered to a lower surface of the second adhesive layer 131.

The carrier film 130 has a function of protecting the bottom of the base film 120 that is directly attached to the OLED panel. In a process of attaching a bottom protection film for an OLED panel according to the present disclosure, to an OLED panel, an alignment process may be performed, and in this case, the liner film 110 is first exfoliated, and then the base film 120 and the carrier film 130 are attached to the OLED panel, and then the carrier film 130 may be exfoliated to locate a protection film on the bottom of the OLED panel.

Here, in order to prevent an electrical short circuit and improve alignment process workability, a surface resistance of the second base material 132 may be $1.0 \times 10^5$ to $1.0 \times 10^9$ Ω/sq, preferably, $1.3 \times 10^5$ to $8.0 \times 10^8$ Ω/sq, to satisfy Condition (1). When the surface resistance of the second base material 132 does not satisfy the above ranges, an electrical short circuit may occur, and alignment process workability may be degraded.

Meanwhile, to prevent generation of static electricity, at least one surface of the second base material 132 included in the carrier film 130 according to the present disclosure, preferably, a lower surface thereof, may be antistatic treated. Through antistatic treatment, generation of static electricity may be prevented and the above-described surface resistance may be obtained, thereby enhancing alignment process workability.

Any material that is typically used in a protection film in the art may be used as the second base materials 132 without limitation, and preferably, a PET base material may be used. In addition, a thickness of the second base material 132 is not limited as long as the thickness is typically used in a protection film, and may preferably be 20 to 60 µm, more preferably, 25 to 55 µm.

Meanwhile, in order to prevent an electrical short circuit and improve alignment process workability, a surface resistance of the second adhesive layer 131 may be $1.0 \times 10^5$ to $1.0 \times 10^9$ Ω/sq, preferably, $1.3 \times 10^5$ to $8.0 \times 10^8$ Ω/sq, to satisfy Condition (1). When the surface resistance of the second adhesive layer 131 does not satisfy the above ranges, an electrical short circuit may occur, and alignment process workability may be degraded.

The second adhesive layer 131 included in the carrier film 130 according to the present disclosure may include an antistatic agent to prevent generation of static electricity. By including the antistatic agent, generation of static electricity may be prevented and the above-described surface resistance may be obtained, thereby enhancing alignment process workability.

Meanwhile, after exfoliating the liner film 110 first, and attaching the base film 120 and the carrier film 130 to the OLED panel, and then when exfoliating the carrier film 130, in order to prevent exfoliation between the OLED panel and the base film 120, an exfoliation force between the base film 120 and the carrier film 130 may be relatively sufficiently small compared to an adhesion of the first adhesive layer 121 of the base film 120, and preferably, to satisfy Condition (2), an exfoliation force between the base film 120 and the carrier film 130 may be 3 to 10 gf/in, more preferably, 4 to 9 gf/in. When the exfoliation force between the base film 120 and the carrier film 130 does not satisfy the above ranges, in an operation of exfoliating the liner film 110, exfoliation between the base film 120 and the carrier film 130 may occur, and exfoliation between the OLED panel and the base film 120 may occur in an operation of exfoliating the carrier film 130 from the base film 120.

As the second adhesive layer 131 included in the carrier film 130, any material for typically forming an adhesive layer in the art may be used without limitation, and the second adhesive layer 131 may preferably be an acrylic adhesive layer. In addition, a thickness of the second adhesive layer 131 is not limited as long as the thickness is a thickness of an adhesive layer typically included in a protection film, and may preferably be 1 to 10 μm, more preferably, 2 to 9 μm.

Detailed description of the second adhesive layer 131 will be provided with reference to a manufacturing method which will be described later.

The bottom protection film for an OLED panel described above may be manufactured using a manufacturing method to be described later, but is not limited thereto.

The bottom protection film for an OLED panel according to the present disclosure may be manufactured using a method including: manufacturing a base film 120 by forming a first adhesive layer 121 by coating and curing a first adhesive composition including a first main agent resin, on an upper surface of a first base material 122; manufacturing a carrier film 130 by forming a second adhesive layer 131 by coating and curing a second adhesive composition including a second main agent resin, on an upper surface of a second base material 132; laminating the base film 120 on an upper surface of the carrier film 130; and laminating the liner film 110 on the laminated base film to manufacture a bottom protection film for an OLED panel.

First, an operation of manufacturing the base film 120 by forming the first adhesive layer 121 by coating and curing a first adhesive composition including a first main agent resin, on an upper surface of the first base material 122 will be described.

The first adhesive composition may include a first main agent resin, and may further include a first curing agent, a solvent, and an antistatic agent.

The first main agent resin may be any resin that may be typically used for forming an adhesive layer having a sufficient adhesion, without limitation, and may preferably be an acrylic resin, and more preferably, polybutyl methacrylate, more preferably, polybutyl methacrylate having a weight average molecular weight of 200,000 to 1,000,000, and most preferably, polybutyl methacrylate having a weight average molecular weight of 400,000 to 800,000.

Also, the first curing agent may be any curing agent that may be used in forming an adhesive layer exhibiting typically sufficient adhesion, without limitation, and preferably, an epoxy curing agent may be used, and more preferably, an epoxyamine curing agent, and even more preferably, N,N,N',N'-tetraglycidyl-m-xylenediamine may be used. The first curing agent may be included in an amount of 0.02 to 0.08 parts by weight, preferably, 0.03 to 0.07 parts by weight, based on 100 parts by weight of the first main agent resin. When the content of the first curing agent is less than 0.02 parts by weight based on 100 parts by weight of the first main agent resin, the first adhesive layer may not be cured to a target level, and when the content of the first curing agent exceeds 0.08 parts by weight, the first adhesive layer may be excessively cured to lower the adhesion.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 35 to 55 parts by weight, preferably 40 to 50 parts by weight, based on 100 parts by weight of the first main agent resin.

The antistatic agent may be any material as long as it prevents static electricity, and preferably, using a pyridine antistatic agent may be useful in preventing static electricity and obtaining a desired surface resistance. The antistatic agent may be included in an amount of 0.5 to 5 parts by weight, preferably, 1 to 4 parts by weight, based on 100 parts by weight of the first main agent resin. When the antistatic agent does not satisfy the above ranges, targeted antistatic effects may not be obtained, and a target surface resistance may not be obtained.

The base film 120 may be manufactured by forming the first adhesive layer 121 by coating and curing the first adhesive composition described above to the upper surface of the first base material 122 having a lower surface that is antistatic treated.

Next, an operation of manufacturing the carrier film 130 by forming the second adhesive layer 131 by coating and curing a second adhesive composition including a second main agent resin, on an upper surface of the second base material 132 will be described.

The second adhesive composition may include a second main agent resin, and may further include a second curing agent, a solvent, and an antistatic agent.

The second main agent resin may be any resin that may be typically used for forming an adhesive layer having a relatively small adhesion compared with the first adhesive layer, without limitation, and may preferably be an acrylic resin, and more preferably, polymethyl methacrylate, even more preferably, polymethyl methacrylate having a weight average molecular weight of 5,000 to 170,000, and most preferably, polymethyl methacrylate having a weight average molecular weight of 50,000 to 150,000.

Also, the second curing agent may be any curing agent that may be used for forming an adhesive layer that exhibits a relatively low adhesion compared with the first adhesive layer, without limitation, and preferably, an isocyanate curing agent may be used. The second curing agent may be included in an amount of 2 to 8 parts by weight, preferably, 3 to 7 parts by weight, based on 100 parts by weight of the second main agent resin. When the content of the second curing agent is less than 2 parts by weight based on 100 parts by weight of the second main agent resin, the second adhesive layer may not be cured to a target level, and when the content of the second curing agent exceeds 8 parts by weight, the second adhesive layer may be excessively cured to lower the adhesion.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 60 to 80 parts by weight, preferably 65 to 75 parts by weight, based on 100 parts by weight of the second main agent resin.

Also, the antistatic agent may be any material as long as it prevents static electricity, and preferably, using a pyridine antistatic agent may be useful in preventing static electricity and obtaining a desired surface resistance. The antistatic agent may be included in an amount of 0.1 to 0.4 parts by weight, preferably, 0.15 to 0.35 parts by weight, based on 100 parts by weight of the second main agent resin. When the antistatic agent does not satisfy the above ranges, targeted antistatic effects may not be obtained and a target surface resistance may not be obtained.

Meanwhile, the second adhesive composition may further include a leveling agent and a wetting agent. The leveling agent and the wetting agent may be any material, without limitation, as long as they are typically used in forming an adhesive layer in the art. Preferably, the leveling agent may be polyacrylate, and the wetting agent may be polyether siloxane, but they are not limited thereto. In addition, the leveling agent may be included in an amount of 0.25 to 2.25 parts by weight, preferably, 0.5 to 2 parts by weight, based on 100 parts by weight of the second main agent resin, and the wetting agent may be included in an amount of 0.2 to 0.8 parts by weight, preferably, 0.3 to 0.7 parts by weight, based on 100 parts by weight of the second main agent resin, but they are not limited thereto.

The carrier film 130 may be manufactured by forming the second adhesive layer 131 by coating and curing the second adhesive composition described above to the upper surface of the second base material 132 having a lower surface that is antistatic treated.

Next, an operation of laminating the base film 120 on an upper surface of the carrier film 130 and an operation of laminating the liner film 110 on the laminated base film to manufacture a bottom protection film for an OLED panel will be described.

Any lamination method that is typically used in the art may be used to laminate the base film 120 on the upper surface of the carrier film 130. Lamination may be performed preferably by using a roll laminator at room temperature, but is not limited thereto.

Also, the liner film 110 may be used without limitation as long as a lamination method that is typically used in the art is used, and preferably, lamination may be performed at room temperature by using a roll laminator to manufacture a bottom protection film for an OLED panel, but is not limited thereto.

According to the present disclosure, a method of applying a bottom protection film for an OLED panel according to the present disclosure, to an OLED panel, is provided; in detail, a method of applying a bottom protection film for an OLED panel is provided, the method including: exfoliating a liner film from the bottom protection film for an OLED panel; attaching a base film and a carrier film, from which the liner film is exfoliated, to an OLED panel; and exfoliating the carrier film from the base film and the carrier film that are attached to the OLED panel.

First, a first alignment process may be performed to exfoliate the liner film from the bottom protection film for an OLED panel, and the liner film may be exfoliated from the bottom protection film for an OLED panel by irradiating light of a wavelength of 400 to 700 nm and sensing reflected light. Here, when the base film and the carrier film do not show an appropriate level of exfoliation force, instead of exfoliation of the liner film, exfoliation between the base film and the carrier film may occur, and this may increase a defect rate.

In addition, a second alignment process may be performed to attach, to the OLED panel, the base film and the carrier film, from which the liner film is exfoliated and the base film and the carrier film may be attached to the OLED panel by irradiating light of a wavelength of 400 to 700 nm and sensing reflected light.

Next, a third alignment process may be performed to exfoliate the carrier film from the base film and the carrier film that are attached to the OLED panel, and the bottom protection film for an OLED panel may be attached to the bottom of the OLED panel by exfoliating the carrier film from the base film and the carrier film attached to the OLED panel by irradiating light of a wavelength of 400 to 700 nm and sensing reflected light.

Meanwhile, the present disclosure includes an organic light-emitting display device 10 implemented by including the above-described base film.

Figure 3:
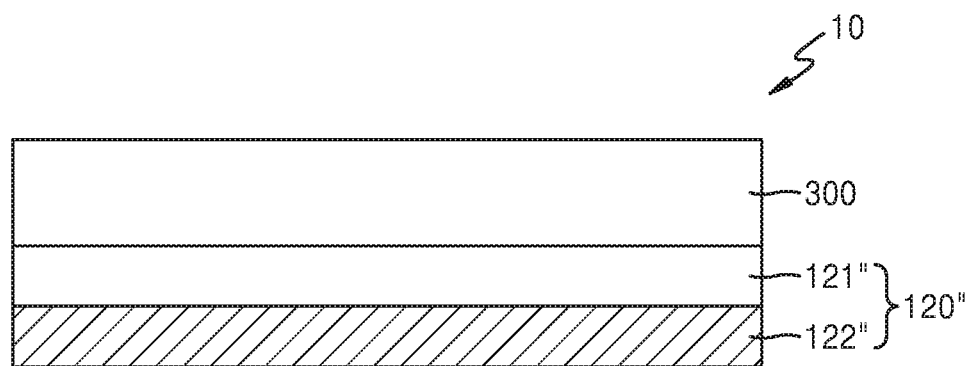
FIG. 3 is a cross-sectional view of an organic light-emitting display device according to an embodiment of the present disclosure.

As in FIG. 3, the organic light-emitting display device 10 may include the base film 120" attached to the bottom of an OLED panel 300. Here, the OLED panel 300 includes a substrate and an organic light-emitting device arranged on the substrate. The organic light-emitting device may be provided by stacking a first electrode, an intermediate layer including an organic emitting layer, and a second electrode. The base film 120" may be attached to the bottom of the substrate of the OLED panel 300. In detail, as the base film 120" including a first adhesive layer 121" having a sufficient adhesion and a first base material 122" having a function of protecting the OLED panel 300 is included, the bottom of the OLED panel 300 may be protected, and generation of static electricity of the OLED panel 300 may be prevented.

Meanwhile, according to the bottom protection film for an OLED panel of the present disclosure, alignment process workability thereof may be excellent, an adhesion to an OLED panel may be excellent, and generation of static electricity may be prevented through antistatic treatment, and also an electrical short circuit may be prevented at the same time.

The present disclosure will be described in more detail with reference to embodiments thereof below but the scope of the present disclosure is not limited by the embodiments, which shall be interpreted as being provided to help to understand the present disclosure.

EXAMPLE 1

(1) Manufacture of Base Film and Liner Film Lamination

A first adhesive composition was prepared by mixing polybutyl methacrylate (BURIM CHEMICAL, BA8900) having a weight average molecular weight of 600,000 as a first main agent resin, 0.05 parts by weight of N,N,N',N'-tetraglycidyl-m-xylenediamine (BURIM CHEMICAL, 45S) as a first curing agent, 2.5 parts by weight of a pyridine antistatic agent (KOEI, IL-P14-2) as an antistatic agent, and 45 parts by weight of methyl ethyl ketone (MEK) as a solvent, based on 100 parts by weight of the first main agent resin.

A base film was manufactured by coating the first adhesive composition on an upper surface of the first base material that is antistatic-treated by coating a thin film of PEDOT/PSS (poly (3,4-ethylenedioxythiophene) polystyrene sulfonate) on a lower surface of a PET base material having a thickness of 75 μm, and an upper surface and the lower surface of the PET base material having a thickness of 75 μm were coated with a thin film of PEDOT/PSS (poly (3,4-ethylenedioxythiophene) polystyrene sulfonate) to antistatic-treat the PET base material, and a thin film of a silicon releasing agent was coated on a lower surface of the liner film to silicon release-treat the liner film, and then the liner film was laminated using a roll laminator at room temperature and cured at 50° C. for 48 hours to manufacture the base film including the first adhesive layer having a thickness of 13 μm and the liner film stacked on the base film.

(2) Manufacture of Carrier Film

A second adhesive composition was prepared by mixing polymethyl methacrylate (SUSAN POLYMER Co., Ltd., SA609) having a weight average molecular weight of 100,000 as a second main agent resin, 5 parts by weight of polyisocyanate (SUSAN POLYMER Co., Ltd., SAX802) as a second curing agent, 0.25 parts by weight of a pyridine antistatic agent (KOEI, IL-P14-2) as an antistatic agent, 1.25 parts by weight of polyacrylate (BYK, BYK361 N) as a leveling agent, polyether siloxane (TEGO, WET270) as a wetting agent, and 70 parts by weight of methyl ethyl ketone (MEK) as a solvent, based on 100 parts by weight of the second main agent resin.

The second adhesive composition was coated on the upper surface of the second base material that is antistatic-treated by coating a thin film of PEDOT/PSS (poly (3,4-ethylenedioxythiophene) polystyrene sulfonate) on a lower surface of a PET base material having a thickness of 38 μm, and cured at 50° C. for 48 hours to prepare a carrier film including a second adhesive layer having a thickness of 5 μm.

(3) Manufacture of OLED Bottom Protection Film

The base film and the carrier film that are laminated with the liner film were laminated at 25° C. by using a roll laminator to manufacture an OLED bottom protection film.

EXAMPLES 2 THROUGH 20 AND COMPARATIVE EXAMPLES 1 THROUGH 4

An OLED panel bottom protection film as shown in Tables 1 through 5 was manufactured in the same manner as Example 1 except by modifying conditions such as the weight average molecular weight of the first main agent resin or the second main agent resin, whether or not to perform release treatment on the lower surface of the liner film, the content of the antistatic agent in the first adhesive composition and the second adhesive composition, whether to perform antistatic treatment on the first base material, the second base material, and the liner film, or the like.

EXPERIMENTAL EXAMPLE 1

1. Measurement of Surface Resistance Value

Surface resistance values of the upper surface and the lower surface of each of the liner film, the base film, and the carrier film of the bottom protection film for an OLED panel manufactured according to Examples and Comparative Examples were measured.

A measurement probe of a 2-point probe was brought into contact with a surface to be measured, by using a surface resistance measurement device (TREK, 152-1), at an evaluation voltage of 10V, for 5 seconds, and a measured value was recorded and listed in Tables 1 through 5 below.

2. Evaluation of Releasing Force, Adhesion, and Exfoliation Force

Regarding the bottom protection film for an OLED panel manufactured according to Examples and Comparative Examples, a 1 inch width of the bottom protection film for an OLED panel was cut and then the bottom protection film was exfoliated at a rate of 40 mm per second at 180° to measure a liner releasing force. A 1 inch width of the bottom protection film for an OLED panel was cut to remove the liner film. Then the bottom protection film was attached to glass having a cleaned surface, and exfoliated, after 24 hours, at a rate of 5 mm per second at 180° to measure an adhesion of the first adhesive layer. A 1 inch width of each of the base film and the carrier film were cut and the carrier film was exfoliated at a rate of 40 mm per second at 180° to measure an exfoliation force between the base film and the carrier film. The measurement result is shown in Tables 1 through 5.

3. Evaluation of Workability of Alignment Process

Workability of an operation of aligning the bottom protection film manufactured according to Examples and Comparative examples, to an OLED panel, was evaluated.

In the first alignment process of exfoliating the liner film from the bottom protection film for an OLED panel, when exfoliating the liner film, workability of the first alignment process was evaluated by marking—○ when only the liner film was exfoliated and marking—X when exfoliation between the base film and the carrier film was generated. Also, workability of the carrier film removing operation (third alignment process) was evaluated by marking—○ when the carrier film was exfoliated by performing the exfoliation once and by marking—x when the carrier film was exfoliated by performing the exfoliation twice or more in the operation of exfoliating the carrier film from the base film and the carrier film attached to the OLED panel. The evaluation result is shown in Tables 1 through 5 below.

4. Adhesive Performance of Bottom Protection Film for OLED Panel

The bottom protection film for an OLED panel manufactured according to Examples and Comparative Examples was attached to an OLED panel at room temperature by using a roll laminator, and after 24 hours, the bottom protection film for an OLED panel was left at a temperature of 60° C. and a humidity of 90% and for 500 hours to identify whether the attached bottom protection film was exfoliated. The adhesive performance of the base film was evaluated by marking—○ when exfoliation did not occur and marking—x when exfoliation occurred. The evaluation result is shown in Tables 1 through 5.

5. Evaluation of Generation of Electrical Short Circuit

The bottom protection film for an OLED panel manufactured according to Examples and Comparative Examples was attached to a chip on film circuit used as a circuit portion of an OLED panel at 25° C. by using a roll laminator, and then whether an electrical circuit is generated when a current is applied to the circuit portion under the condition of a temperature of 60° C. and humidity of 90%. The electrical short circuit was evaluated by marking—○ when an electrical short circuit did not occur and marking—x when an electrical short circuit occurred. This is shown in Tables 1 through 5.

TABLE 1

| Division | | Example 1 | Example 2 | Example 3 | Example 4 | Example 5 |
|---|---|---|---|---|---|---|
| first adhesive composition | first main agent resin weight average molecular weight | 600,000 | 400,000 | 800,000 | 600,000 | 600,000 |
| | antistatic agent (parts by weight) | 2.5 | 2.5 | 2.5 | 2.5 | 2.5 |
| second adhesive composition | second main agent resin weight average molecular weight | 100,000 | 100,000 | 100,000 | 50,000 | 150,000 |
| | antistatic agent (parts by weight) | 0.25 | 0.25 | 0.25 | 0.25 | 0.25 |
| Whether release treatment is performed on lower surface of liner film | | ○ | ○ | ○ | ○ | ○ |
| whether antistatic treatment is performed | lower surface of first base material | ○ | ○ | ○ | ○ | ○ |
| | lower surface of second base material | ○ | ○ | ○ | ○ | ○ |
| | upper surface of liner film | ○ | ○ | ○ | ○ | ○ |
| | lower surface of liner film | ○ | ○ | ○ | ○ | ○ |
| surface resistance | first adhesive layer(Ω/sq) | $3.13 \times 10^{10}$ | $3.13 \times 10^{10}$ | $3.13 \times 10^{10}$ | $3.13 \times 10^{10}$ | $3.13 \times 10^{10}$ |
| | first base material(Ω/sq) | $2.5 \times 10^{7}$ | $2.5 \times 10^{7}$ | $2.5 \times 10^{7}$ | $2.5 \times 10^{7}$ | $2.5 \times 10^{7}$ |
| | upper surface of liner film(Ω/sq) | $2.5 \times 10^{5}$ | $2.5 \times 10^{5}$ | $2.5 \times 10^{5}$ | $2.5 \times 10^{5}$ | $2.5 \times 10^{5}$ |
| | lower surface of liner film(Ω/sq) | $3.0 \times 10^{5}$ | $3.0 \times 10^{5}$ | $3.0 \times 10^{5}$ | $3.0 \times 10^{5}$ | $3.0 \times 10^{5}$ |
| | second adhesive layer(Ω/sq) | $4.7 \times 10^{8}$ | $4.7 \times 10^{8}$ | $4.7 \times 10^{8}$ | $4.7 \times 10^{8}$ | $4.7 \times 10^{8}$ |
| | second base material(Ω/sq) | $2.3 \times 10^{6}$ | $2.3 \times 10^{6}$ | $2.3 \times 10^{6}$ | $2.3 \times 10^{6}$ | $2.3 \times 10^{6}$ |
| Condition 1 | $a_1/A^{1)}$ | 3402.2 | 3402.2 | 3402.2 | 3402.2 | 3402.2 |
| releasing force of liner film (gf/in) | | 3.2 | 3.2 | 3.2 | 3.2 | 3.2 |
| Adhesion of first adhesive layer (gf/in) | | 1680 | 1029 | 2263 | 1680 | 1680 |
| Exfoliation force of base film/carrier film (gf/in) | | 6.6 | 6.6 | 6.6 | 4.1 | 8.8 |
| Condition 2 | $a_3/(b_3 + c_3)$ | 171.4 | 105 | 230.9 | 230.1 | 140 |
| | $b_3/c_3$ | 0.48 | 0.48 | 0.48 | 0.78 | 0.36 |
| workability | first alignment | ○ | ○ | ○ | ○ | ○ |
| | third alignment | ○ | ○ | ○ | ○ | ○ |
| adhesive performance of base film | | ○ | ○ | ○ | ○ | ○ |
| evaluation of electrical short circuit | | ○ | ○ | ○ | ○ | ○ |

[1)] A refers to the average of the other values of the surface resistance of the first base material, the upper surface of the liner film, the lower surface of the liner film, the second adhesive layer, and the second base material, except for a maximum value and a minimum value of the surface resistance.

TABLE 2

| Division | | Example 6 | Example 7 | Example 8 | Example 9 | Example 10 |
|---|---|---|---|---|---|---|
| first adhesive composition | first main agent resin weight average molecular weight | 600,000 | 600,000 | 600,000 | 600,000 | 600,000 |
| | antistatic agent (parts by weight) | 2.5 | 1 | 4 | 7 | 2.5 |

TABLE 2-continued

| Division | | Example 6 | Example 7 | Example 8 | Example 9 | Example 10 |
|---|---|---|---|---|---|---|
| second adhesive composition | second main agent resin weight average molecular weight | 220,000 | 100,000 | 100,000 | 100,000 | 100,000 |
| | antistatic agent (parts by weight) | 0.25 | 0.25 | 0.25 | 0.25 | 0.03 |
| whether release treatment is performed on lower surface of liner film | | ○ | ○ | ○ | ○ | ○ |
| whether antistatic treatment is performed | lower surface of first base material | ○ | ○ | ○ | ○ | ○ |
| | lower surface of second base material | ○ | ○ | ○ | ○ | ○ |
| | upper surface of liner film | ○ | ○ | ○ | ○ | ○ |
| | lower surface of liner film | ○ | ○ | ○ | ○ | ○ |
| surface resistance | first adhesive layer(Ω/sq) | $3.13 \times 10^{10}$ | $1.5 \times 10^{10}$ | $1.0 \times 10^{11}$ | $1.3 \times 10^{12}$ | $3.13 \times 10^{10}$ |
| | first base material(Ω/sq) | $2.5 \times 10^{7}$ | $2.5 \times 10^{7}$ | $2.5 \times 10^{7}$ | $2.5 \times 10^{7}$ | $2.5 \times 10^{7}$ |
| | upper surface of liner film(Ω/sq) | $2.5 \times 10^{5}$ | $2.5 \times 10^{5}$ | $2.5 \times 10^{5}$ | $2.5 \times 10^{5}$ | $2.5 \times 10^{5}$ |
| | lower surface of liner film(Ω/sq) | $3.0 \times 10^{5}$ | $3.0 \times 10^{5}$ | $3.0 \times 10^{5}$ | $3.0 \times 10^{5}$ | $3.0 \times 10^{5}$ |
| | second adhesive layer(Ω/sq) | $4.7 \times 10^{8}$ | $4.7 \times 10^{8}$ | $4.7 \times 10^{8}$ | $4.7 \times 10^{8}$ | $8.2 \times 10^{4}$ |
| | second base material(Ω/sq) | $2.3 \times 10^{6}$ | $2.3 \times 10^{6}$ | $2.3 \times 10^{6}$ | $2.3 \times 10^{6}$ | $2.3 \times 10^{6}$ |
| Condition 1 | $a_1/A^{1)}$ | 3402.2 | 1630.4 | 10869.6 | 141304 | 32947.4 |
| | releasing force of liner film(gf/in) | 3.2 | 3.2 | 3.2 | 3.2 | 3.2 |
| | adhesion of first adhesive layer (gf/in) | 1680 | 1680 | 1680 | 1680 | 1680 |
| | exfoliation force of base film/carrier film (gf/in) | 12.2 | 6.6 | 6.6 | 6.6 | 6.6 |
| Condition 2 | $a_3/(b_3 + c_3)$ | 109.1 | 171.4 | 171.4 | 171.4 | 171.4 |
| | $b_3/c_3$ | 0.26 | 0.48 | 0.48 | 0.48 | 0.48 |
| workability | first alignment | ○ | ○ | ○ | x | ○ |
| | third alignment | x | ○ | ○ | ○ | ○ |
| | adhesive performance of base film | ○ | ○ | ○ | ○ | ○ |
| | evaluation of electrical short circuit | ○ | ○ | ○ | ○ | x |

1)A refers to the average of the other values of the surface resistance of the first base material, the upper surface of the liner film, the lower surface of the liner film, the second adhesive layer, and the second base material, except for a maximum value and a minimum value of the surface resistance.

TABLE 3

| Division | | Example 11 | Example 12 | Example 13 | Example 14 | Example 15 |
|---|---|---|---|---|---|---|
| first adhesive composition | weight average molecular weight of first main agent resin | 600,000 | 600,000 | 600,000 | 600,000 | 600,000 |
| | antistatic agent (parts by weight) | 2.5 | 2.5 | 2.5 | 2.5 | 2.5 |
| second adhesive composition | weight average molecular weight of second main agent resin | 100,000 | 100,000 | 100,000 | 100,000 | 100,000 |
| | antistatic agent (parts by weight) | 0.15 | 0.35 | 1 | 0.25 | 0.25 |
| whether release treatment is performed on lower surface of liner film | | ○ | ○ | ○ | ○ | ○ |

TABLE 3-continued

| | Division | Example 11 | Example 12 | Example 13 | Example 14 | Example 15 |
|---|---|---|---|---|---|---|
| whether antistatic treatment is performed | lower surface of first base material | ○ | ○ | ○ | x | ○ |
| | lower surface of second base material | ○ | ○ | ○ | ○ | x |
| | upper surface of liner film | ○ | ○ | ○ | ○ | ○ |
| | lower surface of liner film | ○ | ○ | ○ | ○ | ○ |
| surface resistance | first adhesive layer($\Omega$/sq) | $3.13 \times 10^{10}$ | $3.13 \times 10^{10}$ | $3.13 \times 10^{10}$ | $3.13 \times 10^{10}$ | $3.13 \times 10^{10}$ |
| | first base material($\Omega$/sq) | $2.5 \times 10^{7}$ | $2.5 \times 10^{7}$ | $2.5 \times 10^{7}$ | $9.1 \times 10^{4}$ | $2.5 \times 10^{7}$ |
| | upper surface of liner film($\Omega$/sq) | $2.5 \times 10^{5}$ | $2.5 \times 10^{5}$ | $2.5 \times 10^{5}$ | $2.5 \times 10^{5}$ | $2.5 \times 10^{5}$ |
| | lower surface of liner film($\Omega$/sq) | $3.0 \times 10^{5}$ | $3.0 \times 10^{5}$ | $3.0 \times 10^{5}$ | $3.0 \times 10^{5}$ | $3.0 \times 10^{5}$ |
| | second adhesive layer($\Omega$/sq) | $2.7 \times 10^{5}$ | $8.0 \times 10^{8}$ | $1.8 \times 10^{9}$ | $4.7 \times 10^{8}$ | $4.7 \times 10^{8}$ |
| | second base material($\Omega$/sq) | $2.3 \times 10^{6}$ | $2.3 \times 10^{6}$ | $2.3 \times 10^{6}$ | $2.3 \times 10^{6}$ | $9.3 \times 10^{4}$ |
| Condition 1 | $a_1/A^{1)}$ | 32717.8 | 3402.2 | 3402.2 | 32947.3 | 3675.1 |
| | releasing force of liner film(gf/in) | 3.2 | 3.2 | 3.2 | 3.2 | 3.2 |
| | adhesion of first adhesive layer (gf/in) | 1680 | 1680 | 1680 | 1680 | 1680 |
| | exfoliation force of base film/carrier film (gf/in) | 6.6 | 6.6 | 6.6 | 6.8 | 6.6 |
| Condition 2 | $a_3/(b_3 + c_3)$ | 171.4 | 171.4 | 171.4 | 168 | 171.4 |
| | $b_3/c_3$ | 0.48 | 0.48 | 0.48 | 0.47 | 0.48 |
| workability | first alignment | ○ | ○ | ○ | ○ | ○ |
| | third alignment | ○ | ○ | x | ○ | ○ |
| | adhesive performance of base film | ○ | ○ | ○ | ○ | ○ |
| | evaluation of electrical short circuit | ○ | ○ | ○ | x | x |

[1)] A refers to the average of the other values of the surface resistance of the first base material, the upper surface of the liner film, the lower surface of the liner film, the second adhesive layer, and the second base material, except for a maximum value and a minimum value of the surface resistance.

TABLE 4

| | Division | Example 16 | Example 17 | Example 18 | Example 19 | Example 20 |
|---|---|---|---|---|---|---|
| first adhesive composition | first main agent resin weight average molecular weight | 600,000 | 600,000 | 600,000 | 600,000 | 600,000 |
| | antistatic agent (parts by weight) | 2.5 | 2.5 | 2.5 | 2.5 | 0.1 |
| second adhesive composition | second main agent resin weight average molecular weight | 100,000 | 100,000 | 100,000 | 100,000 | 100,000 |
| | antistatic agent (parts by weight) | 0.25 | 0.25 | 0.25 | 0.25 | 0.03 |
| | whether release treatment is performed on lower surface of liner film | ○ | ○ | ○ | ○ | ○ |
| whether antistatic treatment is performed | lower surface of first base material | ○ | ○ | x | ○ | ○ |
| | lower surface of second base material | ○ | ○ | x | ○ | ○ |
| | upper surface of liner film | x | ○ | ○ | x | ○ |
| | lower surface of liner film | ○ | x | ○ | x | ○ |

TABLE 4-continued

| | Division | Example 16 | Example 17 | Example 18 | Example 19 | Example 20 |
|---|---|---|---|---|---|---|
| surface resistance | first adhesive layer($\Omega$/sq) | $3.13 \times 10^{10}$ | $3.13 \times 10^{10}$ | $3.13 \times 10^{10}$ | $3.13 \times 10^{10}$ | $6.4 \times 10^{8}$ |
| | first base material($\Omega$/sq) | $2.5 \times 10^{7}$ | $2.5 \times 10^{7}$ | $9.1 \times 10^{4}$ | $2.5 \times 10^{7}$ | $2.5 \times 10^{7}$ |
| | upper surface of liner film($\Omega$/sq) | $8.8 \times 10^{4}$ | $2.5 \times 10^{5}$ | $2.5 \times 10^{5}$ | $8.8 \times 10^{4}$ | $2.5 \times 10^{5}$ |
| | lower surface of liner film($\Omega$/sq) | $3.0 \times 10^{5}$ | $8.6 \times 10^{4}$ | $3.0 \times 10^{5}$ | $8.6 \times 10^{4}$ | $3.0 \times 10^{5}$ |
| | second adhesive layer($\Omega$/sq) | $4.7 \times 10^{8}$ | $4.7 \times 10^{8}$ | $4.7 \times 10^{8}$ | $4.7 \times 10^{8}$ | $8.2 \times 10^{4}$ |
| | second base material($\Omega$/sq) | $2.3 \times 10^{6}$ | $2.3 \times 10^{6}$ | $9.3 \times 10^{4}$ | $2.3 \times 10^{6}$ | $2.3 \times 10^{6}$ |
| Condition 1 | $a_1/A^{1)}$ | 3402.2 | 3402.2 | 146490 | 3428.5 | 673.7 |
| | releasing force of liner film(gf/in) | 3.2 | 3.4 | 3.2 | 3.4 | 3.2 |
| | adhesion of first adhesive layer (gf/in) | 1680 | 1680 | 1680 | 1680 | 1680 |
| | exfoliation force of base film/carrier film (gf/in) | 6.6 | 6.6 | 6.8 | 6.6 | 6.6 |
| Condition 2 | $a_3/(b_3 + c_3)$ | 171.4 | 168 | 168 | 168 | 171.4 |
| | $b_3/c_3$ | 0.48 | 0.52 | 0.47 | 0.52 | 0.48 |
| workability | first alignment | ○ | ○ | ○ | ○ | ○ |
| | third alignment | ○ | ○ | ○ | ○ | ○ |
| | adhesive performance of base film | ○ | ○ | ○ | ○ | ○ |
| | evaluation of electrical short circuit | x | x | x | x | x |

[1)]A refers to the average of the other values of the surface resistance of the first base material, the upper surface of the liner film, the lower surface of the liner film, the second adhesive layer, and the second base material, except for a maximum value and a minimum value of the surface resistance.

TABLE 5

| | Division | Comparative example1 | Comparative example2 | Comparative example3 | Comparative example4 |
|---|---|---|---|---|---|
| first adhesive composition | first main agent resin weight average molecular weight | 100,000 | 600,000 | 600,000 | 600,000 |
| | antistatic agent (parts by weight) | 2.5 | 2.5 | 2.5 | 0.1 |
| second adhesive composition | second main agent resin weight average molecular weight | 100,000 | 4,000 | 100,000 | 100,000 |
| | antistatic agent (parts by weight) | 0.25 | 0.25 | 0.25 | 0.25 |
| Whether release treatment is performed on lower surface of liner film | | ○ | ○ | x | ○ |
| whether antistatic treatment is performed | lower surface of first base material | ○ | ○ | ○ | ○ |
| | lower surface of second base material | ○ | ○ | ○ | ○ |
| | upper surface of liner film | ○ | ○ | ○ | ○ |
| | lower surface of liner film | ○ | ○ | ○ | ○ |
| surface resistance | first adhesive layer($\Omega$/sq) | $3.13 \times 10^{10}$ | $3.13 \times 10^{10}$ | $3.13 \times 10^{10}$ | $6.4 \times 10^{8}$ |
| | first base material($\Omega$/sq) | $2.5 \times 10^{7}$ | $2.5 \times 10^{7}$ | $2.5 \times 10^{7}$ | $2.5 \times 10^{7}$ |

TABLE 5-continued

| Division | | Comparative example1 | Comparative example2 | Comparative example3 | Comparative example4 |
|---|---|---|---|---|---|
| | upper surface of liner film($\Omega$/sq) | $2.5 \times 10^5$ | $2.5 \times 10^5$ | $2.5 \times 10^5$ | $2.5 \times 10^5$ |
| | lower surface of liner film($\Omega$/sq) | $3.0 \times 10^5$ | $3.0 \times 10^5$ | $3.0 \times 10^5$ | $3.0 \times 10^5$ |
| | second adhesive layer($\Omega$/sq) | $4.7 \times 10^8$ | $4.7 \times 10^8$ | $4.7 \times 10^8$ | $4.7 \times 10^8$ |
| | second base material($\Omega$/sq) | $2.3 \times 10^6$ | $2.3 \times 10^6$ | $2.3 \times 10^6$ | $2.3 \times 10^6$ |
| Condition 1 | $a_1/A^{1)}$ | 3402.2 | 3402.2 | 3402.2 | 69.6 |
| releasing force of liner film(gf/in) | | 3.2 | 3.2 | 9.8 | 3.2 |
| Adhesion of first adhesive layer (gf/in) | | 207 | 1680 | 1680 | 1680 |
| Exfoliation force of base film/carrier film (gf/in) | | 6.6 | 1.3 | 6.6 | 6.6 |
| Condition 2 | $a_3/(b_3 + c_3)$ | 21.12 | 373.3 | 102.4 | 171.4 |
| | $b_3/c_3$ | 0.48 | 2.46 | 1.68 | 0.48 |
| workability | first alignment | ○ | x | x | ○ |
| | third alignment | ○ | ○ | ○ | ○ |
| adhesive performance of base film | | x | ○ | ○ | ○ |
| evaluation of electrical short circuit | | ○ | ○ | ○ | x |

$^{1)}$A refers to the average of the other values of the surface resistance of the first base material, the upper surface of the liner film, the lower surface of the liner film, the second adhesive layer, and the second base material, except for a maximum value and a minimum value of the surface resistance.

As shown in Tables 1 through 5,

Examples 1 through 5, 7, 8, 11, and 12 that satisfy the preferable conditions according to the present disclosure, which are related to the weight average molecular weight of the first main agent resin, the second main agent resin, whether the lower surface of the liner film is release-treated, the content of the antistatic agent in the first adhesive composition and the second adhesive composition, whether the first base material, the second base material, and the liner film are antistatic treated, exhibited excellent alignment process workability, excellent adhesive performance of the base film, and also the capability of preventing an electrical short circuit at the same time, compared to Examples 6, 9, 10, 13 through 20 and Comparative Examples 1 through 4 where at least one of the above conditions was omitted.

In detail, Examples 1, 4, and 5 that satisfy the weight average molecular weight of the second main agent resin according to the present disclosure exhibited excellent alignment process workability compared to Example 6 where the weight average molecular weight of the second main agent resin was not met.

In addition, in Examples 1, 7, and 8 that satisfy the content of the antistatic agent included in the first adhesive composition according to the present disclosure, excellent alignment process workability compared to Example 9, which did not satisfy the condition of the content of the antistatic agent, was exhibited.

In addition, in Examples 1, 11, and 12 that satisfy the content of the antistatic agent included in the second adhesive composition according to the present disclosure, no electrical short circuit occurred compared to Example 10, which did not meet the condition of the content of the antistatic agent, and also, excellent alignment process workability was exhibited compared to Example 13.

In addition, in Example 1 in which antistatic treatment was performed on the lower surface of the first base material, the lower surface of the second base material, and the upper and lower surfaces of the liner film, no electrical short circuit occurred compared to Examples 14 through 19 in which the antistatic treatment was omitted on at least one of the lower surface of the first base material, the lower surface of the second base material, and the upper and lower surfaces of the liner film.

In addition, in Example 1 that satisfies the content of the antistatic agent included in the first adhesive composition and the content of the antistatic agent included in the second adhesive composition, according to the present disclosure, no electrical short circuit occurred compared to Example 20 where the contents were not satisfied.

In addition, Examples 1 through 3 that satisfy the weight average molecular weight of the first main agent resin according to the present disclosure exhibited excellent adhesive performance of the base film compared to Comparative Example 1 where the weight average molecular weight of the first main agent resin was not met.

In addition, Examples 1, 4, and 5 that satisfy the weight average molecular weight of the second main agent resin according to the present disclosure exhibited excellent alignment process workability compared to Comparative Example 2 where the weight average molecular weight of the second main agent resin was not satisfied.

In addition, Example 1 in which a releasing treatment was performed on the lower surface of the liner film according to the present disclosure exhibited excellent alignment process workability compared with Comparative Example 3 in which no release treatment was performed.

In addition, in Examples 1, 7 and 8 that satisfy the content of the antistatic agent included in the first adhesive composition according to the present disclosure, no electrical short circuit occurred compared to Comparative Example 4 which did not satisfy the content of the antistatic agent.

While the present disclosure has been particularly shown and described with reference to exemplary embodiments thereof, it is to be understood that the present disclosure is not limited to the disclosed exemplary embodiments, It will be understood by those skilled in the art that various changes such as addition, modification, elimination, or supplementation may be made therein to easily suggest other embodiments, without departing from the spirit and scope of the disclosure as defined by the appended claims.

The invention claimed is:

1. A bottom protection film for an OLED panel, comprising:
    a base film comprising a first adhesive layer disposed on an upper surface of a first base material;
    a carrier film comprising a second adhesive layer adhered to a lower surface of the first base material and a second base material adhered to a lower surface of the second adhesive layer; and
    a liner film adhered utilizinq the first adhesive layer,
    wherein the liner film, the first base material, the first adhesive layer, the second base material, and the second adhesive layer all satisfy Condition (1) and Condition (2) below:

$$100 \leq \frac{a_1}{A}, \quad (1)$$

$$23 \leq \frac{a_3}{b_3 + c_3}, \frac{b_3}{c_3} < 1, \quad (2)$$

where, A denotes the average of the other values except for a maximum value and a minimum value of surface resistances from among $a_2$, $b_1$, $b_2$, $c_1$, and $c_2$, and $a_1$ denotes a surface resistance ($\Omega$/sq) of the first adhesive layer, $a_2$ denotes a surface resistance ($\Omega$/sq) of the first base material, $b_1$ and $b_2$ respectively denote surface resistances ($\Omega$/sq) of upper and lower surfaces of the liner film, $c_1$ denotes a surface resistance ($\Omega$/sq) of the second adhesive layer, and $c_2$ denotes a surface resistance ($\Omega$/sq) of the second base material, and
    $a_3$ denotes adhesion (gf/in) of the base film, $b_3$ denotes a release force (gf/in) of the liner film, and $c_3$ denotes an exfoliation force (gf/in) of the carrier film.

2. The bottom protection film for an OLED panel of claim 1, wherein the liner film, the first base material, the first adhesive layer, the second base material, and the second adhesive layer all satisfy Condition (3) and Condition (4) below:

$$10^3 \leq \frac{a_1}{A} \leq 10^5, \quad (3)$$

$$30 \leq \frac{a_3}{b_3 + c_3} \leq 560, \ 0.3 \leq \frac{b_3}{c_3} \leq 0.9. \quad (4)$$

3. The bottom protection film for an OLED panel of claim 1, wherein a surface resistance of the first adhesive layer is $1.0 \times 10^{10}$ to $1.0 \times 10^{12}$ $\Omega$/sq,
    a surface resistance of the first base material is $1.0 \times 10^5$ to $1.0 \times 10^9$ $\Omega$/sq, and
    surface resistances of the upper and lower surfaces of the liner film are each $1.0 \times 10^5$ to $1.0 \times 10^9$ $\Omega$/sq, and
    surface resistances of the second adhesive layer and the second base material are each $1.0 \times 10^5$ to $1.0 \times 10^9$ $\Omega$/sq.

4. The bottom protection film for an OLED panel of claim 1, wherein the liner film has a release force of 5 gf/in or less.

5. The bottom protection film for an OLED panel of claim 1, wherein adhesion of the first adhesive layer measured by utilizing a measurement method below is 250 gf/in or higher:
    wherein in the measurement method, the first adhesive layer is adhered to glass, and after 24 hours, an adhesion of the first adhesive layer is measured when the first adhesive layer is exfoliated at 180° at a rate of 5 mm per second.

6. The bottom protection film for an OLED panel of claim 1, wherein an exfoliation force between the base film and the carrier film is 3 to 10 gf/in.

7. The bottom protection film for an OLED panel of claim 1, wherein the first base material and the second base material are each a PET base material, and
    the first adhesive layer and the second adhesive layer are acrylic adhesive layers.

8. The bottom protection film for an OLED panel of claim 1, wherein a lower surface of the liner film is silicon release-treated.

9. The bottom protection film for an OLED panel of claim 1, wherein at least one surface of each of the liner film, the first base material, and the second base material is antistatic treated.

10. The bottom protection film for an OLED panel of claim 1, wherein the first adhesive layer and the second adhesive layer comprise an antistatic agent.

11. The bottom protection film for an OLED panel of claim 1, wherein the first adhesive layer has a thickness of 10 to 30 μm, and the first base material has a thickness of 65 to 140 μm.

12. The bottom protection film for an OLED panel of claim 1, wherein the liner film has a thickness of 55 to 95 μm,
    wherein the second adhesive layer has a thickness of 1 to 10 μm, and
    wherein the second base material has a thickness of 20 to 60 μm.

13. A method of applying a bottom protection film for an OLED panel, the method comprising:
    exfoliating a liner film from the bottom protection film;
    attaching, to the OLED panel, a base film and a carrier film, from which the liner film is exfoliated; and
    exfoliating the carrier film from the base film and the carrier film that are attached to the OLED panel,
    wherein the bottom protection film comprises:
    the base film comprising a first adhesive layer on an upper surface of a first base material;
    the carrier film comprising a second adhesive layer adhered to a lower surface of the first base material and a second base material adhered to a lower surface of the second adhesive layer; and
    a liner film adhered utilizing the first adhesive layer,
    wherein the liner film, the first base material, the first adhesive layer, the second base material, and the second adhesive layer all satisfy Condition (1) and Condition (2) below, $$100 \leq \frac{a_1}{A}, \quad (1)$$

$$23 \le \frac{a_3}{b_3+c_3}, \frac{b_3}{c_3} < 1, \quad (2)$$

where, A denotes the average of the other values except for a maximum value and a minimum value of surface resistances from among $a_2$, $b_1$, $b_2$, $c_1$, and $c_2$, and $a_1$ denotes a surface resistance (Ω/sq) of the first adhesive layer, $a_2$ denotes a surface resistance (Ω/sq) of the first base material, $b_1$ and $b_2$ respectively denote surface resistance (Ω/sq) of upper and lower surfaces of the liner film, $c_1$ denotes a surface resistance (Ω/sq) of the second adhesive layer, and $c_2$ denotes a surface resistance (Ω/sq) of the second base material, and $a_3$ denotes adhesion (gf/in) of the base film, $b_3$ denotes a release force (gf/in) of the liner film, and $c_3$ denotes an exfoliation force (gf/in) of the carrier film.

14. An organic light-emitting display device comprising a base film and an OLED panel,
wherein the OLED panel comprises a substrate and an organic light-emitting device on the substrate, and
the base film comprises a base material and an adhesive layer on an upper surface of the base material, and
wherein a surface resistance of the adhesive layer is $1.0 \times 10^{10}$ to $1.0 \times 10^{12}$ Ω/sq, and
a surface resistance of the base material is $1.0 \times 10^5$ to $1.0 \times 10^9$ Ω/sq.

15. The organic light-emitting display device of claim 14, wherein an adhesion of the adhesive layer measured by utilizing a measurement method below is 250 gf/in or higher:
wherein in the measurement method, the adhesive layer was adhered to glass, and after 24 hours, an adhesion of the adhesive layer was measured when the adhesive layer was exfoliated at 180° at a rate of 5 mm per second.

16. The organic light-emitting display device of claim 14, wherein the base material is a PET base material, and
the adhesive layer is an acrylic adhesive layer.

17. The organic light-emitting display device of claim 14, wherein at least one surface of the base material is antistatic treated.

18. The organic light-emitting display device of claim 14, wherein the adhesive layer comprises an antistatic agent.

19. The organic light-emitting display device of claim 14, wherein the adhesive layer has a thickness of 10 to 30 μm, and the base material has a thickness of 65 to 140 μm.

20. The organic light-emitting display device of claim 14, wherein the adhesive layer comprises polybutyl methacrylate and a pyridine antistatic agent,
wherein a thin film comprising poly(3,4-ethylene dioxythiophene)-polystyrene sulfonate (PEDOT/PSS) is coated on a lower surface of the base material.

* * * * *